(12) United States Patent
Zhang

(10) Patent No.: US 6,578,998 B2
(45) Date of Patent: Jun. 17, 2003

(54) LIGHT SOURCE ARRANGEMENT

(75) Inventor: Long Bao Zhang, Anaheim, CA (US)

(73) Assignee: A L Lightech, Inc., Anaheim, CA (US)

( * ) Notice: Subject to any disclaimer, the term of this patent is extended or adjusted under 35 U.S.C. 154(b) by 0 days.

(21) Appl. No.: 09/814,587

(22) Filed: Mar. 21, 2001

(65) Prior Publication Data

US 2002/0136025 A1 Sep. 26, 2002

(51) Int. Cl.[7] .............................................. F21V 7/04
(52) U.S. Cl. ....................... 362/555; 362/800; 362/545; 362/350; 362/296; 362/345; 362/294
(58) Field of Search ................................ 562/555, 800, 562/545, 350, 296, 345, 294; 257/720, 98, 99

(56) References Cited

U.S. PATENT DOCUMENTS

| | | | | |
|---|---|---|---|---|
| 3,609,475 A | * | 9/1971 | Kaposhilin ..................... 257/99 |
| 5,136,483 A | * | 8/1992 | Schoniger et al. ........... 362/545 |
| 5,660,461 A | * | 8/1997 | Ignatius et al. .............. 362/241 |
| 5,924,785 A | * | 7/1999 | Zhang et al. ................ 362/241 |

* cited by examiner

Primary Examiner—Sandra O'Shea
Assistant Examiner—Berstrand Zeade
(74) Attorney, Agent, or Firm—Raymond Y. Chan; David and Raymond Patent Group

(57) ABSTRACT

A light source arrangement includes a cell body having a concave light projecting surface and a semi-spherical reflective cavity surrounded by the light projecting surface, a light source unit including at least two terminal electrodes extended therefrom and at least a luminary element for emitting light when the terminal electrodes are electrified, and a supporting frame having a predetermined width mounted on the cell body to support the light source unit at a focus point of the reflective cavity in such a manner lights emitted from the light source unit are accumulatively collected and reflected by the reflective cavity to outside. Heat is efficiently dissipated by the supporting frame when a larger current is applied to the light source arrangement. Therefore, up to five luminary elements are adapted to be supported in the light source unit for increasing the light intensity of the light source arrangement.

38 Claims, 7 Drawing Sheets

LIGHT SOURCE ARRANGEMENT

BACKGROUND OF THE PRESENT INVENTION

1. Field of Invention

The present invention relates to a high efficiency solid-state light source, and more particularly to a light source arrangement which can enhance brightness of the emitting light and increase the cooling effect of the light source arrangement.

2. Description of Related Arts

Nowadays, the most common light sources for signal lighting are filament lamp bulb and LED lighting. Due to the remarkable features of low power consumption and instant light emission, LED lighting is specially adapted to be utilized in many electrical appliances, such as the power on-off signal light and instructional signal light of electric equipment, indicating light of electronic clock, and etc. . . .

Although the LED has excellent properties of low power consumption and instant light emission, the relatively small light intensity and lighting emission angle of the LED make it not suitable to applied in some specific area such as traffic light, signboard light, vehicle brake light and signal light, and airport guiding lighting.

U.S. Pat. No. 5,924,785, patented by the applicant of the present invention, suggests a light source arrangement that has excellent shock resistant ability, low power consumption property and higher light intensity.

However, if larger current is arranged to apply to the conventional LED or the U.S. Pat. No. 5,924,785 to increase the electrical power, heat is generated from the electronic diode, in which when the heat cannot be dissipated properly, the heat may burn the electronic diode.

In addition, another major drawback of the conventional LED is that the LED cannot produce white light. It is well known that white light is composed of red, blue, and green lights but the LED is merely capable of producing red, blue, and green lights independently.

SUMMARY OF THE PRESENT INVENTION

A main object of the present invention is to improve the U.S. Pat. No. 5,924,785 and provide a light source arrangement which can enhance the brightness of the light emitted from a light source of the light source arrangement.

Another object of the present invention is to provide a light source arrangement which is capable of providing a light intensity up to five times of a conventional LED.

Another object of the present invention is to provide a light source arrangement which can substantially dissipate heat generated from the light cell so as to provide a higher light intensity and prolong the service life span thereof.

Another object of the present invention is to provide a light source arrangement wherein each light source comprises three or more terminal electrodes to produce red, blue, and green lights respectively so as to produce a white light by a single cell body.

Another object of the present invention is to provide a light source arrangement wherein a plurality of cell bodies are adapted to be connected in series and/or in parallel, which is capable of being used as the lighting source of indicating lighting systems, such as traffic light, signboard light, vehicle brake light and signal light.

Accordingly, in order to accomplish the above objects, the present invention is to provide a light source arrangement, which comprises:

a cell body having a concave light projecting surface and a semi-spherical reflective cavity surrounded by the light projecting surface;

a light source unit comprising at least two terminal electrodes and at least a luminary element for emitting light when the terminal electrodes are electrified; and a supporting frame comprising a supporting bridge, which has a thin thickness and a predetermined width functioning as a heat sink, riding across an opening of the reflective cavity of the cell body to support the light source unit at a focus point of the concave light projecting surface for emitting light towards the concave light projecting surface upon energized, and that all emitting light from the light source unit are accumulatively collected and reflected by the reflective cavity to outside while heat generated from the light source unit is dissipate via the supporting bridge.

DETAILED DESCRIPTION OF THE PREFERRED EMBODIMENTS

Figure 1:
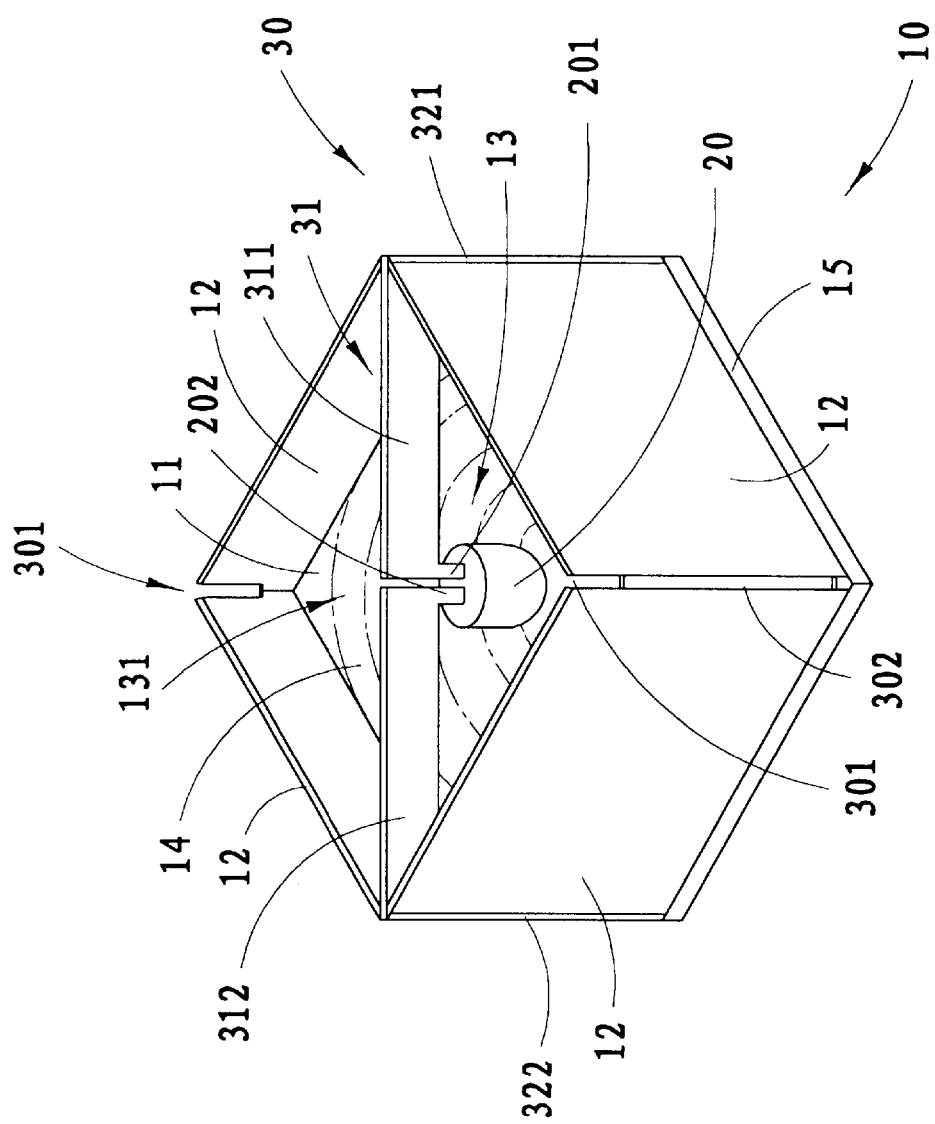
FIG. 1 is a perspective view of a light source arrangement according to a first preferred embodiment of the present invention.
Figure 2:
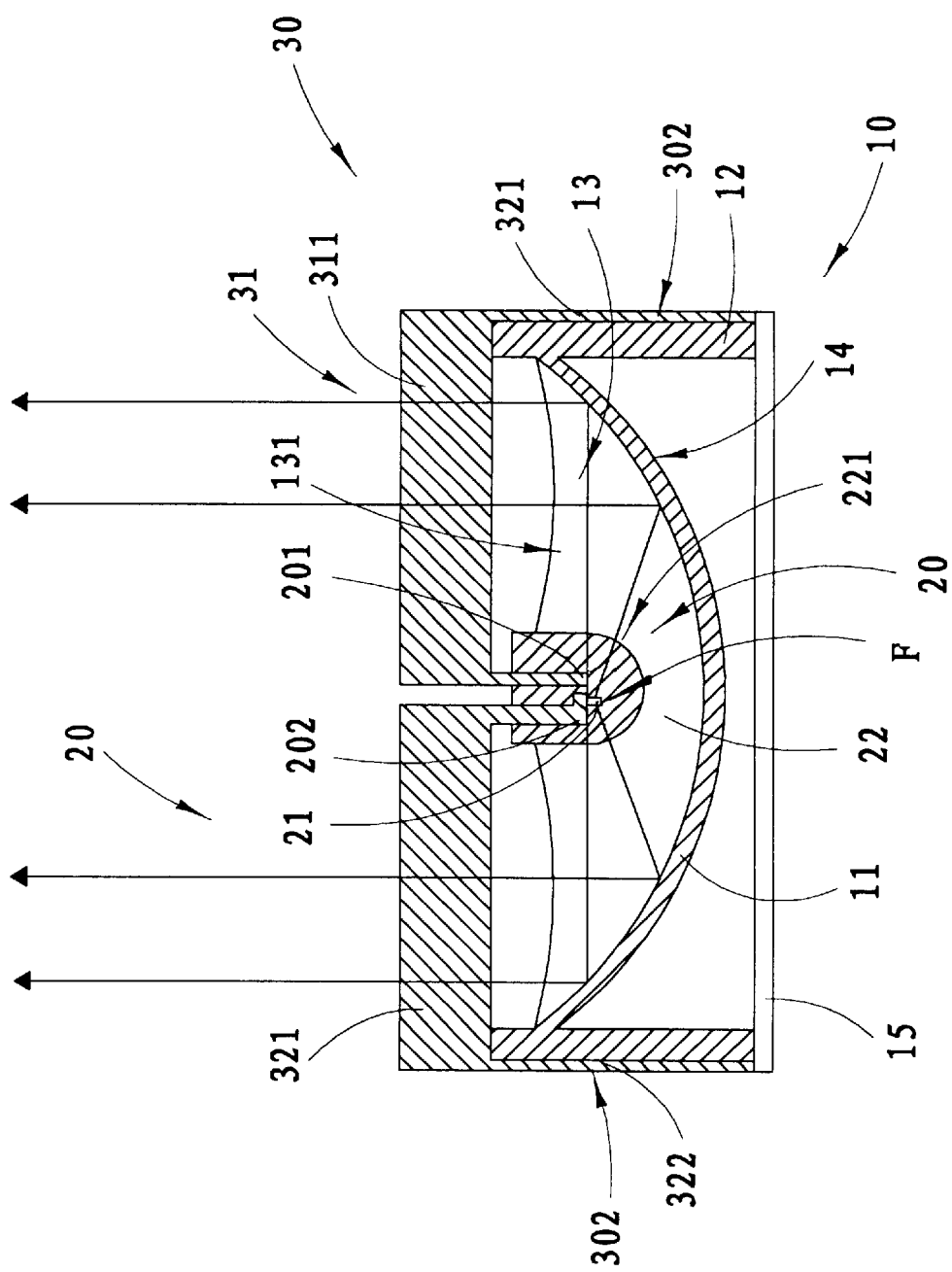
FIG. 2 is a sectional view of the light source arrangement according to the above first preferred embodiment of the present invention.
Figure 3:
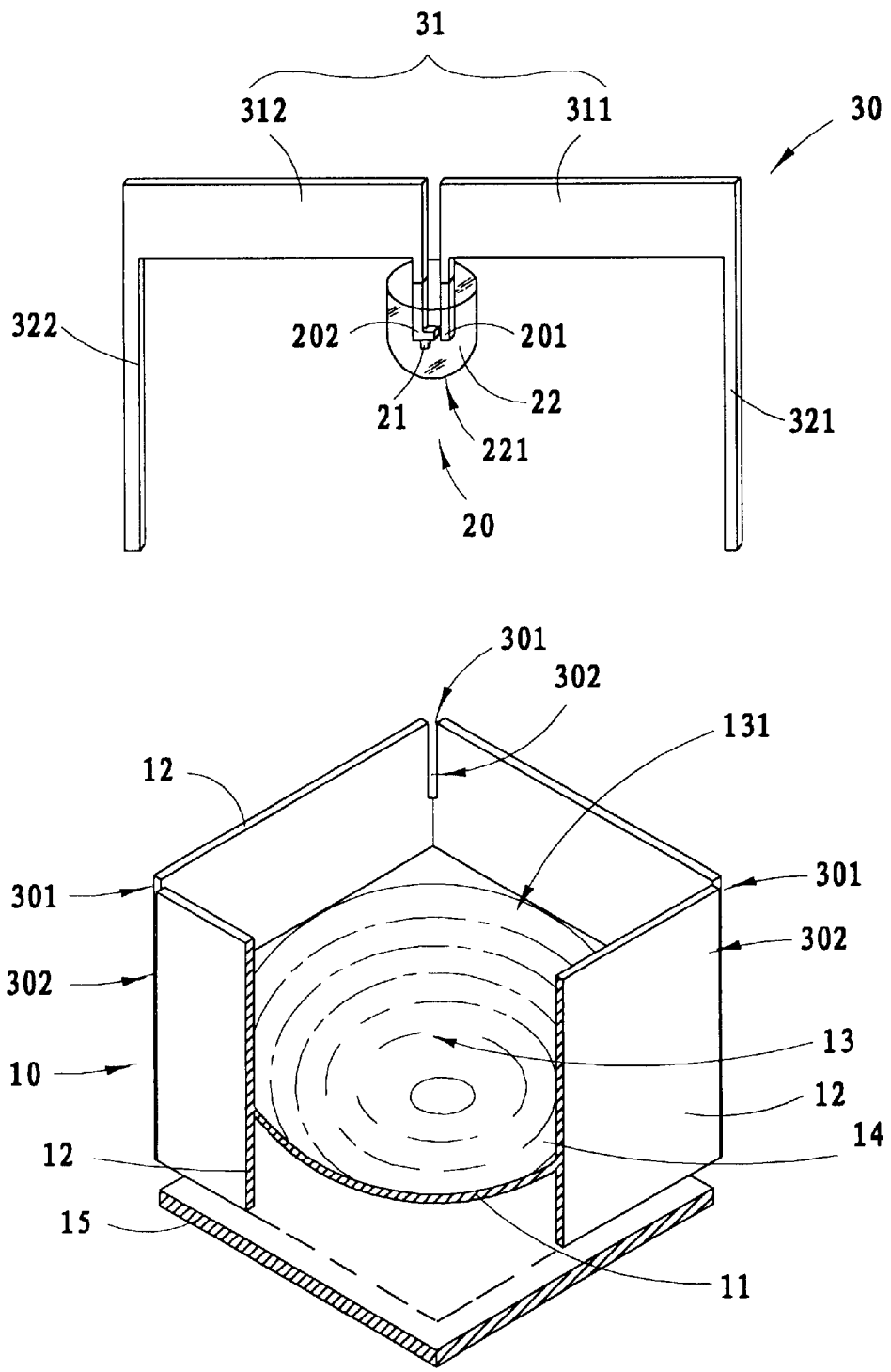
FIG. 3 is an exploded perspective view of the light source arrangement according to the above first preferred embodiment of the present invention.

Referring to FIGS. 1 to 3 of the drawings, a light source arrangement according to a preferred embodiment of the present invention is illustrated, wherein the light source arrangement comprises a cell body 10, a light source unit 20, and a supporting frame 30.

The cell body 10 has a semi-spherical reflective cavity 13 defined and surrounded by a concave light projecting surface 14. The light source unit 20 comprising at least two terminal electrodes 201, 202 and at least a luminary element 21 for emitting light when the terminal electrodes 201, 202 are electrified.

The supporting frame 30 comprises a supporting bridge 31, which has a thin thickness and a predetermined width functioning as a heat sink, riding across an opening 131 of the reflective cavity 13 of the cell body 10 to support the light source unit 20 at a focus point of the concave light projecting surface 14 for emitting light towards the concave light projecting surface 14 upon energized, and that all emitting light from the light source unit 20 are accumulatively collected and reflected by the reflective cavity 13 to outside while heat generated from the light source unit 20 is dissipate via the supporting bridge 31.

According to the preferred embodiment, the cell body 10 comprises a bowl shaped reflecting member 11 and four supporting walls 12 integrally and perpendicularly connected together to form a box shape structure.

A circuit board 15 can be attached to a bottom of the cell body 10 for electrically controlling the light source unit 20. The bowl shaped reflecting member 11 is integrally connected within the supporting walls 12 in such a manner that the bowl shaped reflecting member 11 is inwardly and downwardly extended from the four supporting walls 12 to form the reflective cavity 13 above the bowl shaped reflecting member 11 and within the four supporting walls 12.

In order to achieve the light reflecting ability of the cell body 10, an inner semi-spherical surface of the bowl shaped reflecting member 11 and four upper inner surfaces of the four supporting walls 12 are coated with a layer of light reflecting material such as aluminum, silver, or titanium to form the light projecting surface 14. Alternatively, the entire cell body 10 can be made of light reflecting material such as aluminum, sliver, or titanium to provide the light projecting surface 14.

Preferably, the cell body 10 is formed in square shape to enable the cell body 10 aligning with another cell body 10 side by side precisely and easily in all directions. However, the cell body 10 can be formed in any desired shape according to the use of the cell body 10.

The luminary element 21 of the light source unit 20 is electrically connected with one of the two terminal electrodes 201, 202 which are positioned parallelly and close to each other in such a manner that light is emitted by the luminary element 21 when the two terminal electrodes 201, 202 are electrified. Practically, different kinds of luminary element 21 can produce different colors of light such as red, blue, or green. The light source unit 20 further comprises a solid shell 22 for protecting the luminary element 21 therein, wherein the luminary element 21 is positioned at a center of a semi-spherical shaped head portion 221 of the shell 22 so as to ensure the light emitted from the luminary element 21 to the light projecting surface 14 through the shell 22.

The supporting bridge 31 of the supporting frame 30 comprises two horizontal supporting arms 311, 312, each having a predetermined width, transversely mounted on the cell body 10 respectively, wherein the two terminal electrodes 201, 202 are integrally extended from two inner ends of the two supporting arms 311, 312 respectively into the reflective cavity 13. Two vertical supporting legs 321, 322 are integrally and respectively extended from two outer ends of the two supporting arms 311, 312 and electrically connected to the circuit board 15 respectively.

In order to increase the light intensity of the light source unit 20, a larger current can be applied to the light source arrangement, such that the supporting frame 30 must enlarge its size for supporting the larger current. However, while increasing the thickness of the supporting frame 30, the supporting arms 311, 312 may block the light reflected from the reflective surface 14 to outside. Therefore, the solution is to remain the thickness of the supporting frame 30, or even using a thinner supporting frame 30, but increasing the width of the supporting arms 311, 312, the reflected light will not be blocked the way thereof.

Since the increased width of the two supporting arms 311, 312 substantially enlarges the surface area thereof to efficiently dissipate the heat generated from the light source unit 20, a larger current is capable of applying to the light source unit 20 so as to enhance the brightness of the light source arrangement without burning out the light source unit 20.

Moreover, the wider supporting arms 311, 312 of the supporting frame 30 can more rigidly support the light source unit 20 on the cell body 10, so that no epoxy resin is needed to hold the light source unit 20 in the cell body 10. In other words, by means of the strengthened supporting frame 30, a conventional step of providing a transparent epoxy resin within the cell body 10 can be omitted so as to simplify the process and reduce the manufacturing cost of the light source arrangement.

In order to mount the supporting arms 311, 312 on the cell body 10, the cell body 10 further has four top slots 301 formed at four corners of the square cell body 10 respectively and four longitudinal edge slots 302 which are formed on four corner edges of the cell body 10 and integrally extended from the top slots 301 respectively. The supporting arms 311, 312 are fittedly mounted on the two opposed top slots 301 while the supporting legs 321, 322 are extended along the edge slots 302 to electrically connect to the circuit board 15 respectively, wherein the light source unit 20 is supported at the focus point F of the light projecting surface 14 of the reflecting cavity 13 of the cell body 10 in an upside down manner, as shown in FIG. 2.

Figure 4:
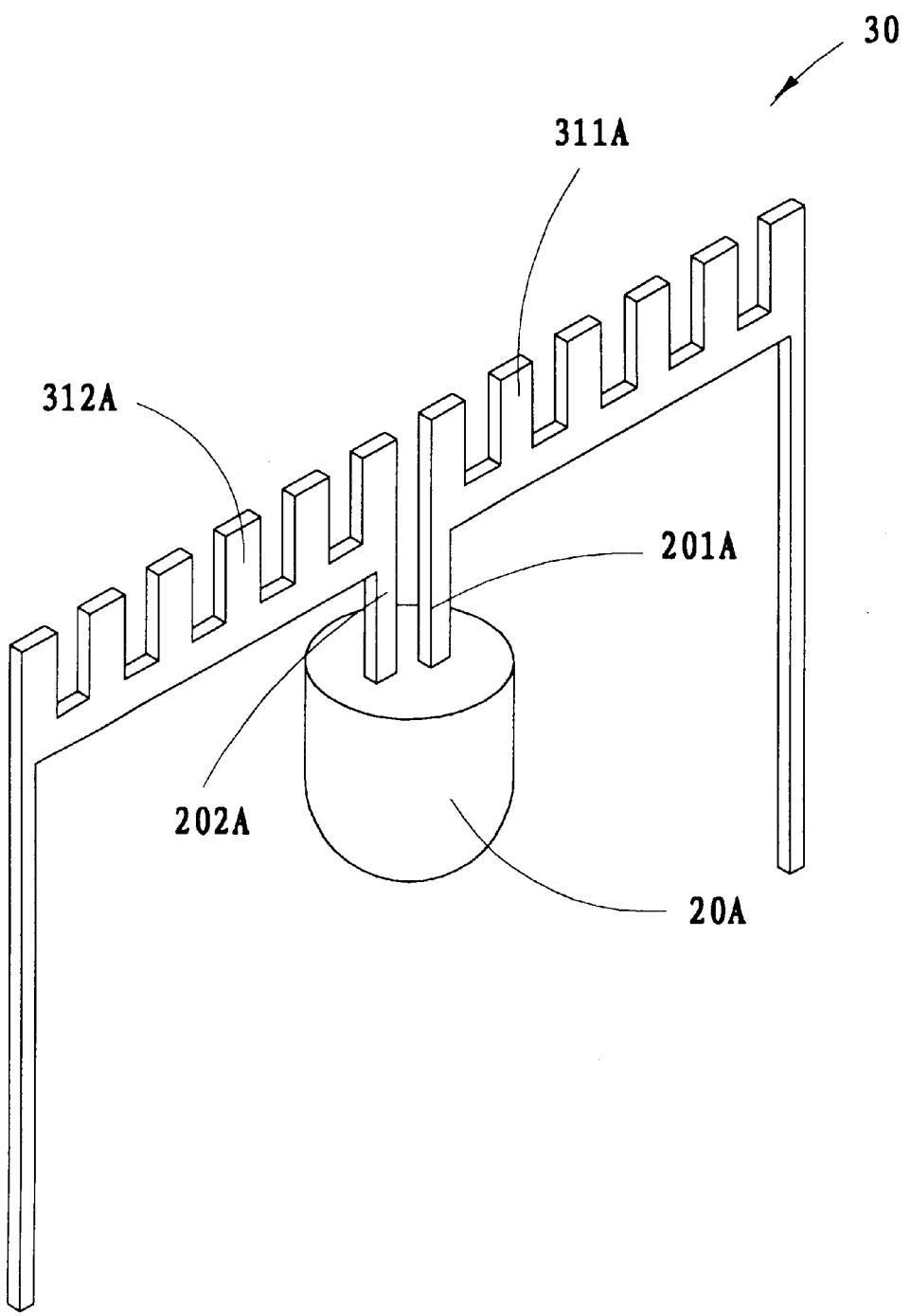
FIG. 4 is an alternative mode of a supporting frame of the light source arrangement according to the above first preferred embodiment of the present invention.

FIG. 4 illustrates an alternative mode of the supporting frame 30A according to the first embodiment the present invention, wherein each of the two supporting arms 311A, 312A of the supporting frame 30A having teeth shaped transversely mounted on the cell body 10 respectively. Since the surface areas of the supporting arms 311A, 312A are enlarged, more heat can be dissipated by the supporting frame 30A so as to prevent the light source arrangement being burnt out by the heat generated by the light source unit 20A.

Figure 5:
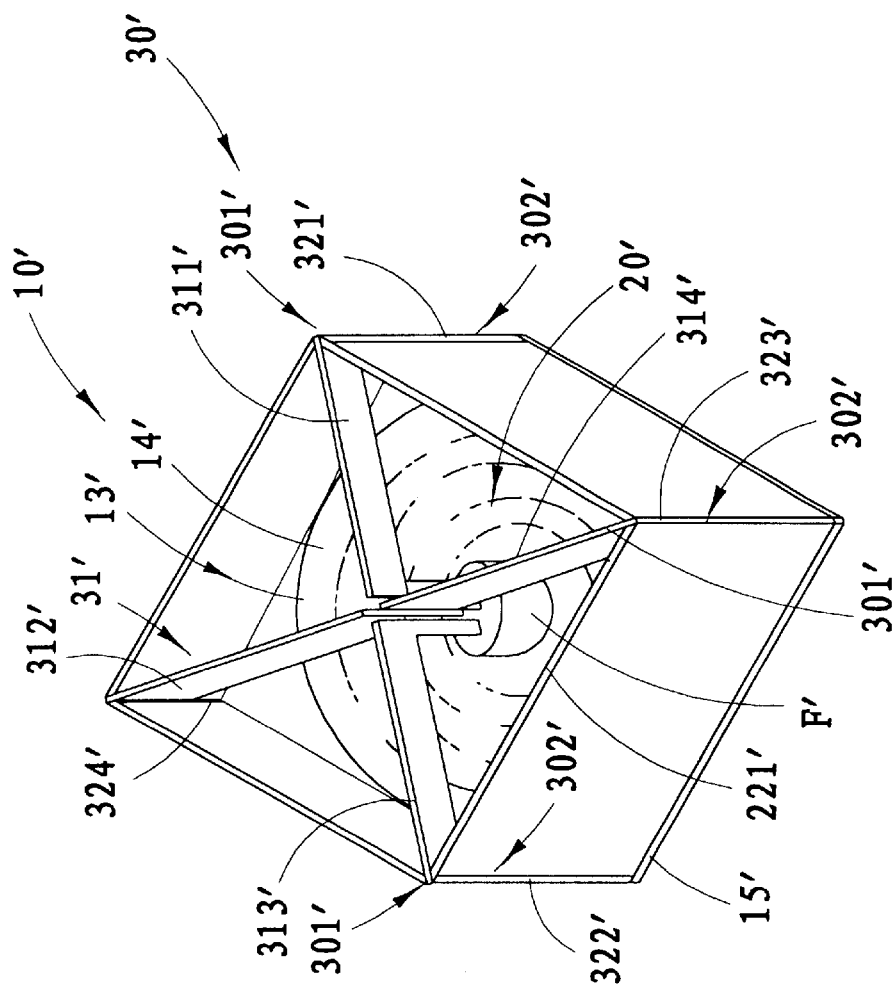
FIG. 5 is a perspective view of a light source arrangement according to a second preferred embodiment of the present invention.

Referring to FIG. 5, a light source arrangement according to a second embodiment of the present invention is illustrated. The second preferred embodiment of the light source arrangement basically is another alternative mode of the first embodiment, wherein the structures of the cell body 10' and the supporting frame 30' of the second embodiment are the same as that of the first embodiment. The light source unit 20' comprises there luminary elements 21', i.e. red, green, blue, for producing white light.

Since the supporting frame 30' is capable of dissipating more heat generated by the light source unit 20', a larger current is adapted for applying to the light source arrangement in such a manner that three luminary elements 21' provided in the light source unit 20' for produce different colors of light in a single cell body 10'.

According to the second preferred embodiment, the supporting bridge 31' of the supporting frame 30' comprises four supporting arms 311', 312', 313', 314' and the light source unit 20' comprises four terminal electrodes 201', 202', 203', 204' downwardly extended from the four supporting arms 311', 312', 313', 314' and three luminary elements 21' electrically connected with three of the terminal electrodes 201', 202', 203', 204'.

For providing a better contact between the terminal electrodes 201', 202', 203', 204', the light source unit 20' further comprises an electrified base 23' on which three luminary elements 21' are disposed thereon. The electrified base 23' is electrically connected to one of the four terminal electrodes 201', so that the three red, green and blue luminary elements 21' are electrically connected with the terminal electrodes 201' via the electrified base 23'. The three luminary elements 21' provided on the electrified base 23' are arranged to electrify with the other three terminal electrodes 202', 203', 204' respectively so as to produce lights from the three luminary elements 21' respectively.

Figure 6:
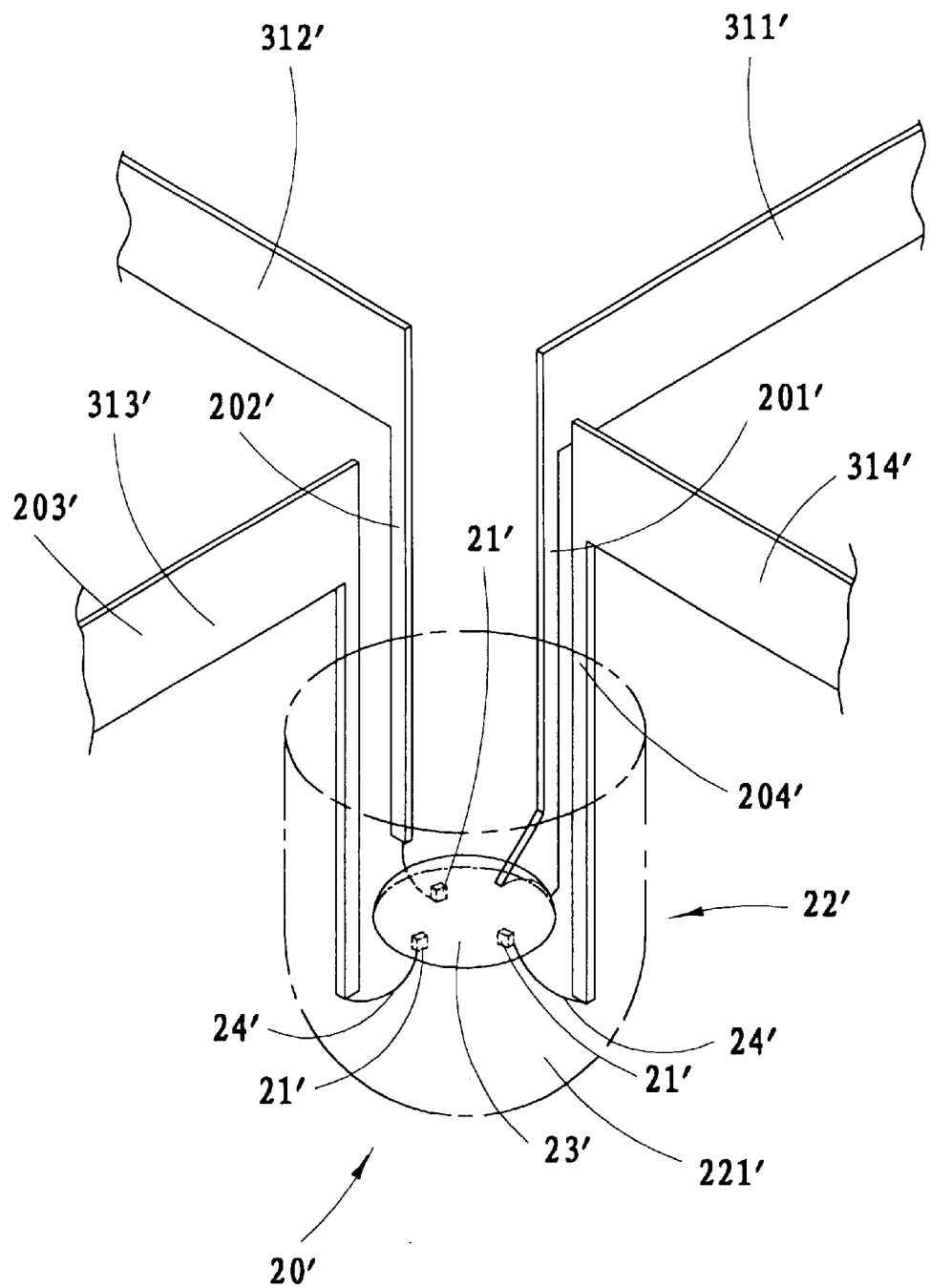
FIG. 6 is a partially enlarged perspective view of the light source arrangement according to the second preferred embodiment of the present invention.

The three terminal electrodes 202', 203', 204' are extended to adjacent with electrified base 23' and aligned with the three luminary elements 21' respectively for electrically connecting the three terminal electrodes 202', 203', 204' with the three luminary elements 21' by means of conduction wires 24' respectively, as shown in FIG. 6.

The light source unit 20' further comprises a solid shell 22' for protecting the luminary elements 21' therein wherein the luminary elements 21' are relatively positioned at a center of a semi-spherical shaped head portion 221' of the shell 22' so as to ensure lights emitted from the three luminary elements 21' at the focus point F of the reflective cavity 13' of the cell body 10'.

Each of the four horizontal supporting arms 311', 312', 313', 314 of the supporting frame 30' has a predetermined width and is transversely mounted on the cell body 10' respectively. The four terminal electrodes 201', 202', 203', 204' are perpendicularly extended from the inner ends of the four horizontal supporting arms 311', 312', 313', 314 of the supporting frame 30', while four vertical supporting legs 321', 322', 323', 324' are integrally extended from the outer ends of the four supporting arms 311', 312', 313', 314 and electrically connected to the circuit board 15' respectively, as shown in FIG. 5.

The four supporting arms 311', 312', 313', 314' are fittedly mounted on the four top slots 301' formed on four corners of the square cell body 10' respectively and the four supporting legs 321', 322', 323', 324' are extended along the edge slots 302' provided at four corner edges of the cell body 10' to electrically connect to the circuit board 15' respectively, so as to support the luminary elements 21' to be located at the focus point F' of the light projecting surface 14' of the reflecting cavity 13' of the cell body 10' in an upside down manner. Thus, the circuit board 15' is arranged to selectively control a flow of the current to the light source unit 20' so as to selectively electrify the terminal electrodes 201', 202', 203', 204' for emitting light from the luminary elements 21'.

It is worth to mention that white light is composed of red, blue, and green lights. So, when all the three luminary elements 21', which are made of different materials to respectively emit red, blue, and green lights, are electrified to produce the red, blue and green lights at the focus point F' at the same time, a white light is produced. It is well known that since the three luminary elements 21' are positioned close together at the focus point F', human's eyes cannot distinguish the red, blue, and green lights individually but mixed together to form the white light. So, the light source arrangement can produce white light while the conventional LED can only produce one primary color such as red, blue, or green individually. In other words, by means of the control circuit provided in the circuit board 15', the light source unit 10' can be controlled to selectively electrify the specific luminary element 21' or combination of luminary elements 21' to produce red light, blue light, green light, or other color lights.

Figure 7:
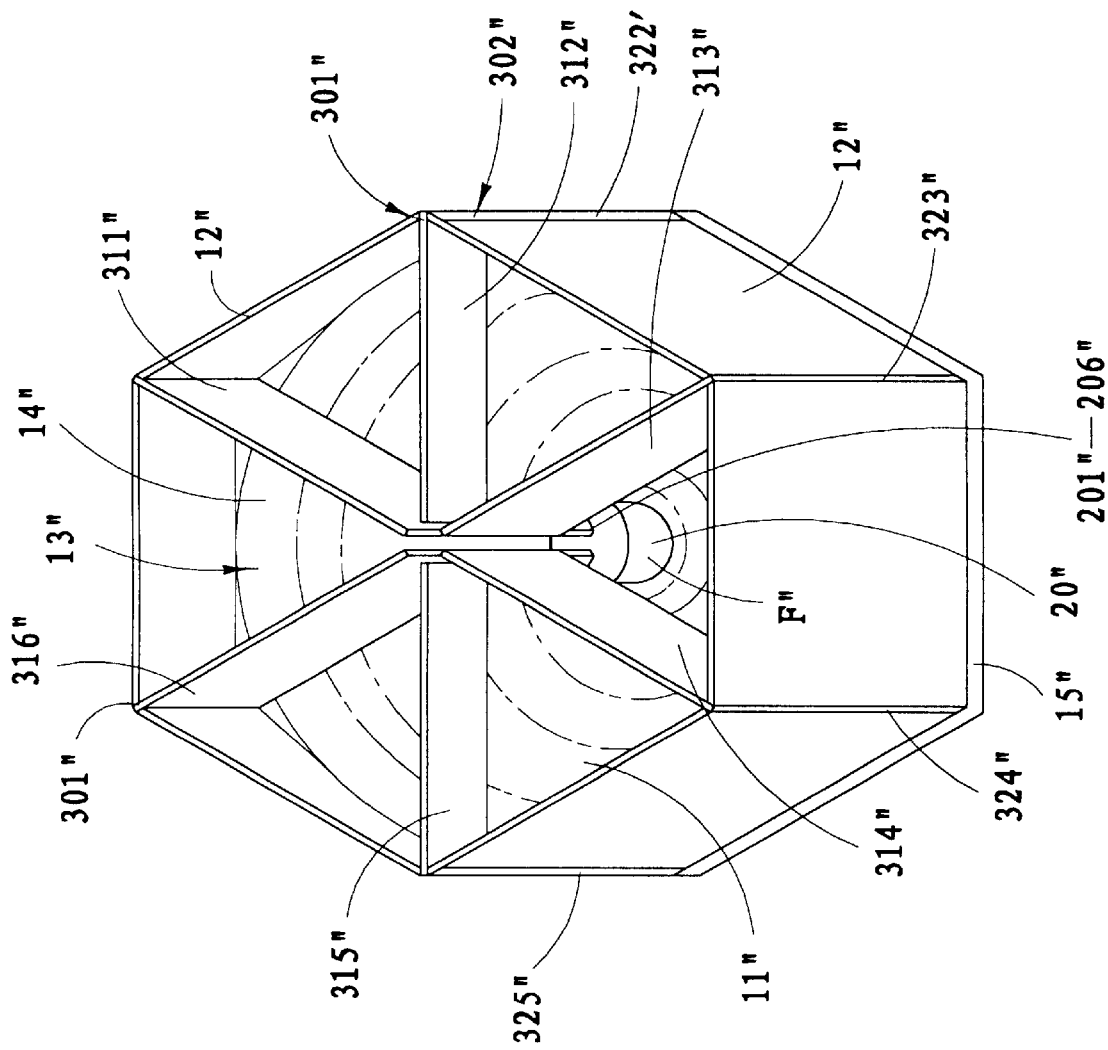
FIG. 7 is a perspective view of a light source arrangement according to a third preferred embodiment of the present invention.

Referring to FIG. 7, a third embodiment of the light source arrangement is illustrated, which is a modification of the second embodiment, wherein the light source unit 20" of the light source arrangement comprises six terminal electrodes 201", 202", 203", 204", 205", 206" radially extended therefrom and five luminary elements 21" for producing five times light intensity in one single cell body 10" comparing with the conventional LED. When five luminary elements 21" are made of different materials, five different colors of light can be produced in one single cell body 10".

As shown in FIG. 7, the cell body 10" having a hexagonal shaped comprises six supporting walls 12" integrally connected together to form a hexagonal shape structure, and a circuit board 15" provided on a bottom of the cell body 10" for controlling the light source unit 20". A bowl shaped reflecting member 11" is integrally connected within the supporting walls 12" in such a manner that the bowl shaped reflecting member 11" is inwardly and downwardly extended from the six supporting walls 12" to form a reflective cavity 13" so as to form a light projecting surface 14" on the reflective cavity 13".

Similarly, the supporting frame 30" comprises six horizontal supporting arms 311", 312", 313", 314", 315", 316" transversely mounted at six top slots 301" formed on six corners of the cell body 10", six terminal electrodes 201", 202", 203", 204", 205", 206" downwardly extended from the six inner ends of the six supporting arms 311", 312", 313", 314", 315", 316", and six supporting legs 321", 322", 323", 324", 325", 326" downwardly extended from six outer ends of the six supporting arms 311", 312", 313", 314", 315", 316" along the six edge slots 302" provided at the six corner edges of the cell body 10" to electrically connected to the circuit board 15", as shown in FIG. 7.

It is worth to mention that a plurality of cell bodies are adapted to be connected in series and/or in parallel, which is capable of being used as the lighting source of indicating lighting system, such as traffic light, signboard light, vehicle brake light and signal light since the light source arrangement can provide better light intensity up to five times than the conventional LED.

What is claimed is:

1. A light source arrangement, comprising:

a cell body having a reflective cavity defined and surrounded by a concave light projecting surface;

a light source unit comprising a first and a second terminal electrode and a first luminary element for emitting light when said terminal electrodes are electrified; and a supporting frame comprising a heat dissipating and supporting bridge riding across an opening of said reflective cavity of said cell body to support said light source unit at a focus point of said reflective cavity with respect to said concave light projecting surface for emitting light towards said concave light projecting surface upon energized, wherein all emitting light from said light source unit are accumulatively collected and reflected by said concave light projecting surface to outside, wherein said heat dissipating and supporting bridge has a thin thickness and a predetermined width wider than said thin thickness that substantially enlarges a surface area thereof and dissipates heat generated from said light source unit.

2. A light source arrangement, as recited in claim 1, wherein said first luminary element of said light source unit is electrically connected with one of said first and second terminal electrodes which are positioned parallelly and close to each other in such a manner that light is emitted by said first luminary element when said first and second terminal electrodes are electrified.

3. A light source arrangement, as recited in claim 1, wherein said heat dissipating and supporting bridge of said supporting frame comprises two horizontal supporting arms, each having said predetermined width, transversely mounted on said cell body respectively, and said supporting frame further comprises two vertical supporting legs integrally and respectively extended from two outer ends of said two supporting arms, wherein said two terminal electrodes are integrally extended from two inner ends of said two supporting arms respectively into said reflective cavity.

4. A light source arrangement, as recited in claim 2, wherein said heat dissipating and supporting bridge of said supporting frame comprises two horizontal supporting arms, each having said predetermined width, transversely mounted on said cell body respectively, and said supporting frame further comprises two vertical supporting legs integrally and respectively extended electrodes from two outer ends of said two supporting arms, wherein said two terminal electrodes are integrally extended from two inner ends of said two supporting arms respectively into said reflective cavity.

5. A light source arrangement, as recited in claim 1, wherein said light source unit further comprises at least another two terminal electrodes and at least another two luminary elements, wherein said light source unit further comprises an electrified base on which said three luminary elements are disposed thereon, wherein said electrified base is electrically connected to one of said terminal electrodes and said other terminal electrodes are extended to adjacent with electrified base and aligned with said three luminary elements respectively, wherein said three luminary elements provided on said electrified base are arranged to electrify with said other three terminal electrodes respectively so as to produce lights from said three luminary elements respectively.

6. A light source arrangement, as recited in claim 5, wherein said heat dissipating and supporting bridge of said supporting frame comprises four supporting arms each of which has said predetermined width and is transversely mounted on said cell body, wherein said first, second, third and fourth terminal electrodes are perpendicularly extended from four inner ends of said four supporting arms of said supporting frame, wherein said supporting frame further comprises four vertical supporting legs integrally extended from said outer ends of said four supporting arms and electrically connected to said circuit board respectively.

7. A light source arrangement, as recited in claim 2, wherein said light source unit further comprises a shell for protecting said luminary element therein, wherein said luminary element is positioned at a center of a semi-spherical shaped head portion of said shell so as to ensure said light emitted from said luminary element to said light projecting surface through said shell.

8. A light source arrangement, as recited in claim 4, wherein said light source unit further comprises a shell for protecting said luminary element therein, wherein said luminary element is positioned at a center of a semi-spherical shaped head portion of said shell so as to ensure said light emitted from said luminary element to said light projecting surface through said shell.

9. A light source arrangement, as recited in claim 5, wherein said light source unit further comprises a shell for protecting said luminary elements therein, wherein said luminary elements are positioned at a center of a semi-spherical shaped head portion of said shell so as to ensure said light emitted from said luminary elements to said light projecting surface through said shell.

10. A light source arrangement, as recited in claim 6, wherein said light source unit further comprises a shell for protecting said luminary elements therein, wherein said luminary elements are positioned at a center of a semi-spherical shaped head portion of said shell so as to ensure said light emitted from said luminary elements to said light projecting surface through said shell.

11. A light source arrangement, as recited in claim 1, further comprising a circuit board attached to a bottom of said cell body for electrically controlling said light source unit.

12. A light source arrangement, as recited in claim 2, further comprising a circuit board attached to a bottom of said cell body for electrically controlling said light source unit wherein said two supporting legs are electrically connected to said circuit board respectively.

13. A light source arrangement, as recited in claim 4, further comprising a circuit board attached to a bottom of said cell body for electrically controlling said light source unit wherein said two supporting legs are electrically connected to said circuit board respectively.

14. A light source arrangement, as recited in claim 5, further comprising a circuit board attached to a bottom of said cell body for electrically controlling said light source unit wherein said four supporting legs are electrically connected to said circuit board respectively.

15. A light source arrangement, as recited in claim 6, further comprising a circuit board attached to a bottom of said cell body for electrically controlling said light source unit wherein said four supporting legs are electrically connected to said circuit board respectively.

16. A light source arrangement, as recited in claim 8, further comprising a circuit board attached to a bottom of said cell body for electrically controlling said light source unit wherein said two supporting legs are electrically connected to said circuit board respectively.

17. A light source arrangement, as recited in claim 10, further comprising a circuit board attached to a bottom of said cell body for electrically controlling said light source unit wherein said four supporting legs are electrically connected to said circuit board respectively.

18. A light source arrangement, as recited in claim 2, wherein said cell body comprises a bowl shaped reflecting member and four supporting walls integrally and perpendicularly connected together to form a box shape structure, wherein an inner semi-spherical surface of said bowl shaped reflecting member and four upper inner surfaces of said four supporting walls are made of light reflecting material.

19. A light source arrangement, as recited in claim 4, wherein said cell body comprises a bowl shaped reflecting member and four supporting walls integrally and perpendicularly connected together to form a box shape structure, wherein an inner semi-spherical surface of said bowl shaped reflecting member and four upper inner surfaces of said four supporting walls are made of light reflecting material, wherein said bowl shaped reflecting member is integrally connected within said supporting walls in such a manner that said bowl shaped reflecting member is inwardly and downwardly extended from said four supporting walls to form said reflective cavity above said bowl shaped reflecting member and within said four supporting walls.

20. A light source arrangement, as recited in claim 6, wherein said cell body comprises a bowl shaped reflecting member and four supporting walls integrally and perpendicularly connected together to form a box shape structure, wherein an inner semi-spherical surface of said bowl shaped reflecting member and four upper inner surfaces of said four supporting walls are made of light reflecting material, wherein said bowl shaped reflecting member is integrally connected within said supporting walls in such a manner that said bowl shaped reflecting member is inwardly and downwardly extended from said four supporting walls to form said reflective cavity above said bowl shaped reflecting member and within said four supporting walls.

21. A light source arrangement, as recited in claim 7, wherein said cell body comprises a bowl shaped reflecting member and four supporting walls integrally and perpendicularly connected together to form a box shape structure, wherein an inner semi-spherical surface of said bowl shaped reflecting member and four upper inner surfaces of said four supporting walls are made of light reflecting material, wherein said bowl shaped reflecting member is integrally connected within said supporting walls in such a manner that said bowl shaped reflecting member is inwardly and downwardly extended from said four supporting walls to form said reflective cavity above said bowl shaped reflecting member and within said four supporting walls.

22. A light source arrangement, as recited in claim 8, wherein said cell body comprises a bowl shaped reflecting member and four supporting walls integrally and perpendicularly connected together to form a box shape structure, wherein an inner semi-spherical surface of said bowl shaped reflecting member and four upper inner surfaces of said four supporting walls are made of light reflecting material, wherein said bowl shaped reflecting member is integrally connected within said supporting walls in such a manner that said bowl shaped reflecting member is inwardly and downwardly extended from said four supporting walls to form said reflective cavity above said bowl shaped reflecting member and within said four supporting walls.

23. A light source arrangement, as recited in claim 9, wherein said cell body comprises a bowl shaped reflecting member and four supporting walls integrally and perpendicularly connected together to form a box shape structure, wherein an inner semi-spherical surface of said bowl shaped reflecting member and four upper inner surfaces of said four supporting walls are made of light reflecting material, wherein said bowl shaped reflecting member is integrally connected within said supporting walls in such a manner that said bowl shaped reflecting member is inwardly and downwardly extended from said four supporting walls to form said reflective cavity above said bowl shaped reflecting member and within said four supporting walls.

24. A light source arrangement, as recited in claim 10, wherein said cell body comprises a bowl shaped reflecting member and four supporting walls integrally and perpendicularly connected together to form a box shape structure, wherein an inner semi-spherical surface of said bowl shaped reflecting member and four upper inner surfaces of said four supporting walls are made of light reflecting material, wherein said bowl shaped reflecting member is integrally connected within said supporting walls in such a manner that said bowl shaped reflecting member is inwardly and downwardly extended from said four supporting walls to form said reflective cavity above said bowl shaped reflecting member and within said four supporting walls.

25. A light source arrangement, as recited in claim 13, wherein said cell body comprises a bowl shaped reflecting member and four supporting walls integrally and perpendicularly connected together to form a box shape structure, wherein an inner semi-spherical surface of said bowl shaped reflecting member and four upper inner surfaces of said four supporting walls are made of light reflecting material, wherein said bowl shaped reflecting member is integrally connected within said supporting walls in such a manner that said bowl shaped reflecting member is inwardly and downwardly extended from said four supporting walls to form said reflective cavity above said bowl shaped reflecting member and within said four supporting walls.

26. A light source arrangement, as recited in claim 14, wherein said cell body comprises a bowl shaped reflecting member and four supporting walls integrally and perpendicularly connected together to form a box shape structure, wherein an inner semi-spherical surface of said bowl shaped reflecting member and four upper inner surfaces of said four supporting walls are made of light reflecting material, wherein said bowl shaped reflecting member is integrally connected within said supporting walls in such a manner that said bowl shaped reflecting member is inwardly and downwardly extended from said four supporting walls to form said reflective cavity above said bowl shaped reflecting member and within said four supporting walls.

27. A light source arrangement, as recited in claim 15, wherein said cell body comprises a bowl shaped reflecting member and four supporting walls integrally and perpendicularly connected together to form a box shape structure, wherein an inner semi-spherical surface of said bowl shaped reflecting member and four upper inner surfaces of said four supporting walls are made of light reflecting material, wherein said bowl shaped reflecting member is integrally connected within said supporting walls in such a manner that said bowl shaped reflecting member is inwardly and downwardly extended from said four supporting walls to form said reflective cavity above said bowl shaped reflecting member and within said four supporting walls.

28. A light source arrangement, as recited in claim 16, wherein said cell body comprises a bowl shaped reflecting member and four supporting walls integrally and perpendicularly connected together to form a box shape structure, wherein an inner semi-spherical surface of said bowl shaped reflecting member and four upper inner surfaces of said four supporting walls are made of light reflecting material, wherein said bowl shaped reflecting member is integrally connected within said supporting walls in such a manner that said bowl shaped reflecting member is inwardly and downwardly extended from said four supporting walls to form said reflective cavity above said bowl shaped reflecting member and within said four supporting walls.

29. A light source arrangement, as recited in claim 17, wherein said cell body comprises a bowl shaped reflecting member and four supporting walls integrally and perpendicularly connected together to form a box shape structure, wherein an inner semi-spherical surface of said bowl shaped reflecting member and four upper inner surfaces of said four supporting walls are made of light reflecting material, wherein said bowl shaped reflecting member is integrally connected within said supporting walls in such a manner that said bowl shaped reflecting member is inwardly and downwardly extended from said four supporting walls to form said reflective cavity above said bowl shaped reflecting member and within said four supporting walls.

30. A light source arrangement, as recited in claim 18, wherein said cell body further has two top slots formed at two opposing corners of said cell body respectively and two longitudinal edge slots which are formed on two opposing corner edges of said cell body and integrally extended from said top slots respectively, wherein said two supporting arms are fittedly mounted on said two opposing top slots while said supporting legs are extended along said edge slots respectively.

31. A light source arrangement, as recited in claim 19, wherein said cell body further has two top slots formed at two opposing corners of said cell body respectively and two longitudinal edge slots which are formed on two opposing corner edges of said cell body and integrally extended from said top slots respectively, wherein said two supporting arms are fittedly mounted on said two opposing top slots while said supporting legs are extended along said edge slots respectively.

32. A light source arrangement, as recited in claim 20, wherein said cell body further has four top slots formed at four corners of said cell body respectively and four longitudinal edge slots which are formed on four corner edges of said cell body and integrally extended from said top slots respectively, wherein said supporting arms are fittedly mounted on said top slots while said supporting legs are extended along said edge slots respectively.

33. A light source arrangement, as recited in claim 22, wherein said cell body further has two top slots formed at two opposing corners of said cell body respectively and two longitudinal edge slots which are formed on two opposing corner edges of said cell body and integrally extended from said top slots respectively, wherein said two supporting arms are fittedly mounted on said two opposing top slots while said supporting legs are extended along said edge slots respectively.

34. A light source arrangement, as recited in claim 24, wherein said cell body further has four top slots formed at four corners of said cell body respectively and four longitudinal edge slots which are formed on four corner edges of said cell body and integrally extended from said top slots respectively, wherein said supporting arms are fittedly mounted on said top slots while said supporting legs are extended along said edge slots respectively.

35. A light source arrangement, as recited in claim 25, wherein said cell body further has two top slots formed at two opposing corners of said cell body respectively and two longitudinal edge slots which are formed on two opposing corner edges of said cell body and integrally extended from said top slots respectively, wherein said two supporting arms are fittedly mounted on said two opposing top slots while said supporting legs are extended along said edge slots respectively to electrically connect to said circuit board respectively.

36. A light source arrangement, as recited in claim 27, wherein said cell body further has four top slots formed at four corners of said cell body respectively and four longitudinal edge slots which are formed on four corner edges of said cell body and integrally extended from said top slots respectively, wherein said supporting arms are fittedly mounted on said top slots while said supporting legs are extended along said edge slots respectively to electrically connect to said circuit board respectively.

37. A light source arrangement, as recited in claim 28, wherein said cell body further has four top slots formed at four corners of said cell body respectively and four longitudinal edge slots which are formed on four corner edges of said cell body and integrally extended from said top slots respectively, wherein said supporting arms are fittedly mounted on said top slots while said supporting legs are extended along said edge slots respectively to electrically connect to said circuit board respectively.

38. A light source arrangement, as recited in claim 29, wherein said cell body further has four top slots formed at four corners of said cell body respectively and four longitudinal edge slots which are formed on four corner edges of said cell body and integrally extended from said top slots respectively, wherein said supporting arms are fittedly mounted on said top slots while said supporting legs are extended along said edge slots respectively to electrically connect to said circuit board respectively.

\* \* \* \* \*